Dec. 27, 1960

R. G. HIBBERD 2,966,434

SEMI-CONDUCTOR DEVICES

Filed Nov. 20, 1958

INVENTOR
ROBERT GUY HIBBERD,

BY [signature]
ATTORNEY 2,966,434
Patented Dec. 27, 1960

2,966,434

SEMI-CONDUCTOR DEVICES

Robert G. Hibberd, Rugby, England, assignor to The British Thomson-Houston Company Limited, London, England, a British company Filed Nov. 20, 1958, Ser. No. 775,218

2 Claims. (Cl. 148—33)

This invention relates to semi-conductor devices of the kind comprising three or more P–N junctions. The invention is applicable, for instance, to P–N–P–N devices and N–P–N–P devices.

Hitherto in forming multiple junction devices difficulty has been experienced due to the fact that these normally require a heat treatment and if the junctions are formed successively the heat treatment employed in forming the subsequent junctions is liable to damage the previously formed junctions.

It is known to produce P–N junctions by employing silicon with aluminium alloyed to it to form a P-type element. There is, however, a large difference between the coefficients of linear thermal expansion of silicon and aluminium which is liable to set up a shear if the junction is heated and cooled and this may result in a mechanically weak junction.

It is also known to form junctions by fusing indium to germanium but such junctions will only stand relatively low temperatures.

According to the present invention a method of forming a multiple junction semi-conductor device includes a first step consisting in forming one or more P–N junctions by alloying semi-conductive germanium of negative conductivity type with semi-conductive silicon of positive conductivity type and a second stage consisting in fusing indium to the germanium to form a further P–N junction therewith.

It will be appreciated that with such a process the germanium silicon junction or junctions are first made and then the indium is fused and as the latter process requires a much lower temperature than is used in forming the germanium silicon junction the latter will not be damaged by the formation of the indium germanium junction.

In order that the invention may be more clearly understood reference will now be made to the accompanying drawing, which shows two examples of devices embodying the invention.

Figure 1:
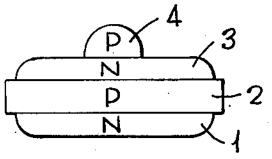

In the drawing Fig. 1 shows a P–N–P–N or N–P–N–P transistor in which layer 2 consists of P-type silicon whilst layers 1 and 3 are of N-type germanium which are fused to opposite sides respectively of the silicon wafer 2. This constitutes the first stage of the process. When this stage is completed a pellet 4 of indium is fused to the N-type layer 3 of germanium to form a P–N junction therewith.

Figure 2:
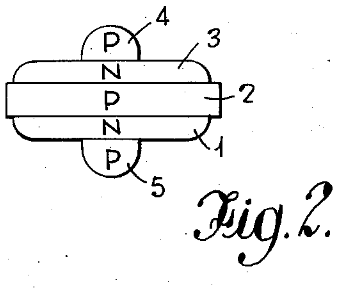

Fig. 2 shows a further arrangement in which a P–N–P–N–P transistor is formed. This is similar to the arrangement shown in Fig. 1 excepting that a further junction is formed by fusing indium, indicated by the reference 5, to the lower germanium layer 1.

The germanium silicon junction may be formed by taking a wafer of P-type silicon and alloying N-type germanium to both sides. After alloying the germanium is lapped down and then indium is alloyed to the lapped surface. In the case of Fig. 1 it would only be necessary to lap down the layer 3 whilst in the Fig. 2 arrangement both layers 1 and 3 would be lapped. Ohmic contacts may be made to the silicon and germanium using such alloys as gold-gallium or tin-indium to the P-type silicon and gold-antimony or tin-arsenic to the N-type germanium. The alloying operation may be effected either in a muffle type furnace or a continuous belt tunnel furnace either in an inert atmosphere or in a vacuum.

Leakage paths across the junction can be removed by etching the completed unit, using either a chemical etch with a mixture of hydrofluoric and nitric acids, or an electrolytic etch using a caustic solution.

Such devices may be encapsulated with a suitable material whose melting point is not sufficiently high to cause damage to the junctions.

What I claim is:

1. A multiple junction semi-conductor device including at least a layer of semi-conductive germanium of negative conductivity type fused to a layer of semi-conductive silicon of positive conductivity type to form a P–N junction and an indium electrode fused to the germanium to form a further P–N junction therewith.

2. A multiple junction semi-conductor device comprising a layer of P-type semi-conductive silicon, two layers of N-type semi-conductive germanium each fused to a respective face of said silicon layer to form P–N junctions with said silicon layer and an indium electrode fused to at least one of said germanium layers to form a further P–N junction therewith.

References Cited in the file of this patent

UNITED STATES PATENTS

| | | |
|---|---|---|
| 2,569,347 | Shockley | Sept. 25, 1951 |
| 2,821,493 | Carman | Jan. 28, 1958 |